United States Patent [19]

Schwirtlich et al.

[11] Patent Number: 5,013,393
[45] Date of Patent: May 7, 1991

[54] PROCESS FOR THE MELTING AND DIRECTIONAL SOLIDIFICATION OF METALS

[75] Inventors: Ingo Schwirtlich; Peter Woditsch, both of Krefeld, Fed. Rep. of Germany

[73] Assignee: Bayer Aktiengesellschaft, Fed. Rep. of Germany

[21] Appl. No.: 517,235

[22] Filed: May 1, 1990

Related U.S. Application Data

[63] Continuation of Ser. No. 117,693, Nov. 5, 1987, abandoned, which is a continuation of Ser. No. 901,609, Aug. 29, 1986, abandoned.

[30] Foreign Application Priority Data

Sep. 10, 1985 [DE] Fed. Rep. of Germany ....... 3532142

[51] Int. Cl.$^5$ .............................................. C30B 11/02
[52] U.S. Cl. ................................. 156/616.2; 156/616.4
[58] Field of Search ............ 156/616 R, 624, DIG. 64, 156/616.1, 616.2, 616.4, 616.41; 164/122, 122.1, 122.2, 125

[56] References Cited

U.S. PATENT DOCUMENTS

| | | | |
|---|---|---|---|
| 2,719,799 | 10/1955 | Christian | 156/616 R |
| 3,012,865 | 12/1961 | Pellin | 156/616 R |
| 3,268,963 | 8/1966 | Mann | 164/122.1 |
| 3,620,289 | 11/1971 | Phipps | 164/122.1 |
| 4,175,610 | 11/1979 | Zauher et al. | 164/122.2 |
| 4,561,930 | 12/1985 | Schwirtlich et al. | 164/122.2 |

*Primary Examiner*—Helen M. S. Sneed
*Assistant Examiner*—R. Bruce Breneman
*Attorney, Agent, or Firm*—Connolly & Hutz

[57] ABSTRACT

A process for the production of columnlarly solidified metallic bodies by melting metal and then solidifying said metal in a crucible, wherein the dissipation of heat is greater at the upper or lower end of the crucible than at the sides, which comprises supplying heat to the verticals sides through a heating element having a plurality of individually controlled heating sections in such a quantity that a melt of the metal is formed and then establishing directional solidification by establishing a temperature gradient by varying the heat output among the heating sections of the heating element by switching.

2 Claims, 1 Drawing Sheet

PROCESS FOR THE MELTING AND DIRECTIONAL SOLIDIFICATION OF METALS

CROSS-REFERENCES TO RELATED APPLICATIONS

This is a continuation of application Ser. No. 07/117,693, filed Nov. 5, 1987, now abandoned, which in turn is a continuation of application Ser. No. 06/901,609, filed Aug. 29, 1986, (now abandoned).

BACKGROUND OF THE INVENTION

This invention relates to a process for the production of columnarly solidified bodies by melting metals and subsequently solidifying them in a crucible wherein the dissipation of heat is greater at the upper or lower end of the crucible than at the sides.

In view of the shortage and increasing cost of fossil fuels, the search for renewable energy sources has been stepped up worldwide. In this connection, particular efforts are being made to find ways of utilizing energy from the sun.

In addition to thermal energy recovery techniques, the direct conversion of solar energy into electricity using the photovoltaic effect in suitable semiconductors is a very promising alternative method of meeting the future energy demand.

Solar cells based on silicon are now virtually the sole power supply basis for space satellites. However, the silicon used from semiconductor technology is generally too expensive for terrestrial energy production.

A major step in the cost reduction chain is the replacement of complicated techniques for growing single crystals by a rapid and economical crystallization process.

Over recent years, there has been no shortage of attempts to develop inexpensive processes for producing silicon suitable for solar cells.

For example, U.S. Pat. No. 4,243,471 describes a process for producing crystalline silicon by directional solidification. In this process, the expansion of around 10% which the silicon undergoes in changing from the liquid to the solid state is counteracted by allowing silicon which has been melted in a medium-frequency-heated graphite susceptor to solidify from the bottom by gradual lowering of the crucible (Bridgman technique). The use of an ingot mold having an expansion coefficient of 3.0 to 4.3 $10^{-6} \, C^{-1}$ is intended to ensure that directionally solidified silicon is not exposed at these temperatures to any thermal stresses arising out of adhesion of the silicon to the vessel wall or out of the greater coefficient of expansion by comparison with the silicon. Although this process does avoid the onset of crystallization on the crucible wall at considerable expense, it is attended by the serious disadvantage that it requires an elaborate and hence expensive apparatus so that an increase in production by operating several such units in parallel does not lead to the desired reduction in costs.

According to German 3,138,227 (=U.S. Ser. No. 191,260) or U.S. Pat. No. 4,218,418 silicon is fused in a quartz vessel and is held at a temperature just above its melting point. A monocrystalline silicon seed arranged from the outset on the bottom of the quartz vessel and kept by cooling at a temperature which prevents it from melting serves as a seed crystal in this process. The effect of this is that crystallization takes place from the bottom over a period of several hours by cooling of the silicon with development of a convex phase boundary. Using this process, it is possible to obtain predominantly monocrystalline zones, in addition to which the silicon melt is additionally purified because of the different solubilities of most of the impurities in liquid and solid silicon. The disadvantage of this so-called heat-exchange process lies in the slow solidification of the melt volume because the entire heat of fusion (which for silicon is large) has to be dissipated through the gas-cooled monocrystalline silicon plate and the deficient heat capacity of the cooling gas. Even with relatively small blocks, this leads to long crystallization times of several hours. Silicon blocks measuring $20 \times 20 \times 10$ cm$^3$ require crystallization times of several days.

The purifying effect accompanying the slow crystallization in view of the segregation coefficients for impurities in silicon is common to all processes in which the crystallization rate is directional and adjustable under control.

According to German 2,745,247, shaped silicon bodies having a columnar structure are obtained by pouring a silicon melt into a mold and allowing the melt to solidify, the contact surface of the mold with one of the two largest mutually opposite boundary surfaces of the melt being kept at a maximum temperature of 1200° C. and the opposite boundary surface of the melt being exposed to a temperature some 200° to 1000° C. above that temperature, but below the solidus temperature of silicon. The mold is then cooled, the heat of fusion of the silicon being dissipated by intensive cooling of the mold base.

Additional losses of heat through the walls of the mold cannot be avoided in this way. Accordingly, the heat of fusion is not dissipated through the bottom of the mold alone, but also through the side walls.

In view of the concave form of the phase boundary, mechanical separation of the zones rich in impurity atoms from those of low concentration is only possible with heavy losses of material.

German 3,223,896 describes a process and an apparatus for the directional solidification of melts in which heat of crystallization is dissipated as in German 3,138,227 through the bottom of the mold without using a seed crystal. Several heating systems and a cooling system are required for carrying out this process, making it expensive both in terms of cost and in terms of equipment.

Accordingly, the object of the present invention is to provide a simple and economic process with which relatively large amounts of silicon can be melted and which does not have any of the disadvantages of the described processes.

SUMMARY OF THE INVENTION

According to the invention, this object is achieved by a process for the production of columnarly solidified bodies by melting metals and subsequently solidifying the molten metals in a crucible, the dissipation of heat being greater at the upper or lower sides of the crucible than at the other sides, characterized in that heat is supplied to the vertical sides through a heating element in such a quantity that a melt is formed and directional solidification is obtained via a temperature gradient by varying the heat output of parts of the heating element simply by switching over.

BRIEF DESCRIPTION

Figure 1:
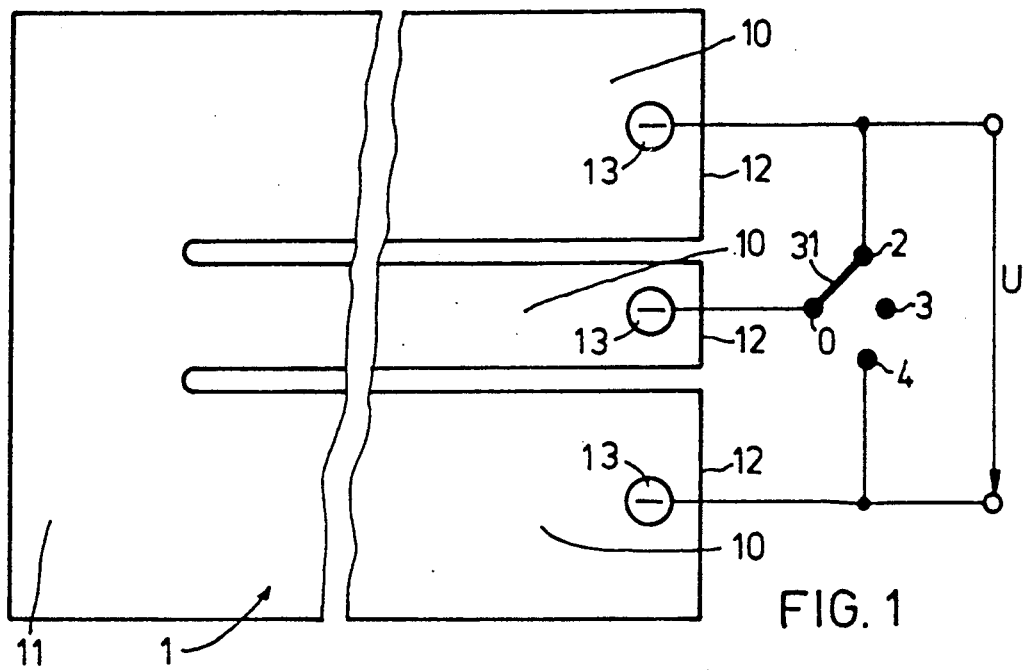
FIG. 1 illustrates a 3-prong heating element useful in this invention.

The present invention relates to a process for the production of columns of solidified metallic bodies by melting metal and then solidifying said metal in a crucible, wherein the dissipation of heat is greater at the upper and lower ends of the crucible than at the sides, which comprises supplying heat to the vertical sides through a heating element having a plurality of individually controlled heating sections in such a quantity that a melt of the metal is formed and then establishing directional solidification by establishing a temperature gradient by varying the heat output among the heating sections of the heating element by switching.

Where this process is applied, the surface area of a flat solid-liquid interface remains constant during the crystallization process so that the increase in the concentration of impurities per unit area as solidification advances is considerably smaller than would be the case if a concave interface were formed between the zones of high and low impurity concentration. Accordingly, mechanical separation is possible with only minimal losses of material. The impurity-rich parts separated off may then either be discarded or recycled.

The development of a flat solid-liquid interface presupposes a temperature field which is characterized by a well-oriented temperature gradient.

By contrast, a homogeneous temperature field is required for melting the charge. The temperature must be above the melting point of the metal to be melted.

The process according to the invention is suitable for melting various metals. However, it is particularly preferred for melting silicon.

In one particularly preferred embodiment of the process according to the invention, the heating element is bent into a hollow form or is composed of plate-like elements. In this way, it is possible to impose the desired temperature field on the walls of the mold.

With this arrangement, heat can only be dissipated downwards through the walls of the mold towards the cooled base thereof. In this way, the vertical orientation of the temperature gradient in the mold is not adversely affected.

The establishment of a homogeneous temperature field, as required for melting, is achieved by varying the heat output in parts of the heating element. In this way, different temperature gradients may be established with a single heating element.

If a resistance band arranged over the mold opening is inserted in the upper part of the resistance heating element, it is possible to establish steep temperature gradients given correspondingly intensive heating of the mold base.

In development, the heating element preferably has a meander-like or comb-like form. The heating element preferably is made from metals, such as Mo, Ta and Nb or from graphite or silicon carbide.

The tongue-like bands may be interconnected by an external connection to form resistance meanders of different electrical resistance. Heating is obtained by connecting comb-like slots to form parallel current paths. The temperature is preferably regulated by switching over, alternatively on and off, these current paths to vary the heat output in the corresponding parts of the heating element which in turn varies the temperature gradient in the melting crucible.

To illustrate this principle, FIG. 1 of the accompanying drawing shows a simple version of a suitable heating device comprising three tongues and an external change-over switch.

Figure 2:
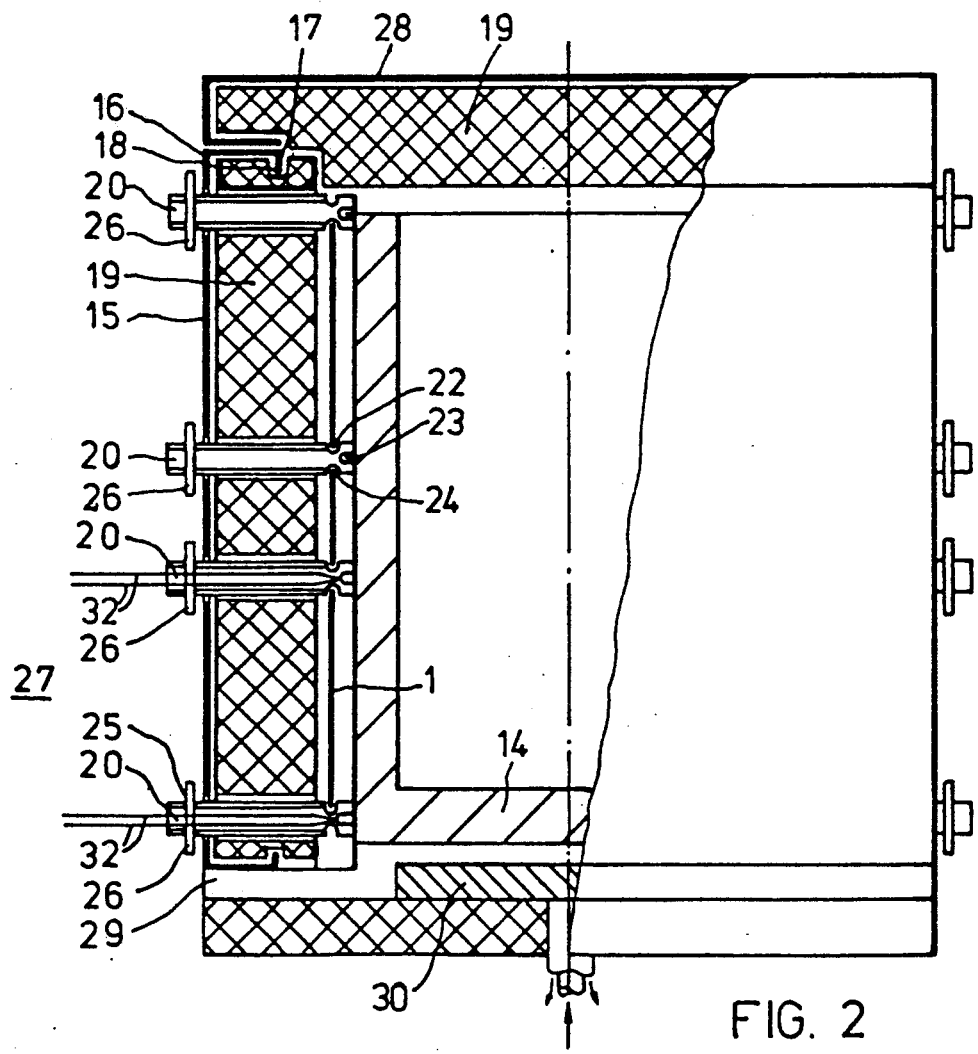
FIG. 2 illustrates the heated mold assembly, partly in cross-section, used in this invention.

FIG. 2 shows the apparatus with the mold introduced, partly in cross-section.

The process and apparatus according to the invention are described in more complete detail in the following exemplarily discussion.

A heating element comprising three heating bands of the type shown in FIG. 1 may readily be made, for example, from 0.2 mm Mo-sheet. It has conductor bands cut out in the shape of tongues (10), the width ratios of which determine the distribution of heat.

The individual tongues are interconnected (11) at one end. The width of the connecting conductor bands is preferably selected so that it coincides with the widest tongue.

A hole is provided for fastening the terminals (13) in the free ends of the tongue-shaped conductor bands (12).

It is found that good results are obtained when the width ratio of the three tongues is $1:\times:1$ with $0.2 \leq \times \leq 0.4$.

The heating element thus prepared is then bent into a hollow shape corresponding to the dimensions of the mold.

The arrangement of the sheet-form heating element (1) around a square mold (14) is shown partly in section in FIG. 2. To guarantee a uniform temperature profile, the connecting part of the conductor bands is bent in the form of a U or horse shoe.

A supporting structure is required for the mechanically stable arrangement of the heating element. The layer sequence of this supporting structure (27) is shown on the left-hand side of FIG. 2. It comprises a steel jacket (15) which is bent twice at a right-angle (16), (17) on two opposite sides. The insulation (19) is inserted into the guide rails (18) thus formed. A radiation shield or fiber mats of oxide ceramics or graphite may be used the the insulation. The sheet-form heating element is held on this body by ceramic pins (20) comprising three grooves (22), (23), (24) on the side carrying the heater (1). The grooves (22) and (24) form two parallel chords equidistant from the pin axis. The third groove (23) is in the front of the pin.

The opposite side of the hollow pin is provided with two slots (25) which form two parallel chords offset through 90° relative to (22), (24) and equidistant from the pin axis. A U-shaped piece (26) of sheet metal engages in these slots, preventing the pin (20) from sliding out. The supporting structure with the sheet-form heating element (1) may be designed in such a way that it can be fitted around the mold. In the case of rectangular molds, this is achieved by a four-part construction of the supporting structure in which the individual parts are joined together by hinges. For round molds, it is best to use a two-part construction in the form of half-shells.

The mold (14) containing the metal to be melted is introduced into the supporting structure (27) with the sheet-form heating element (1).

To prevent heat from escaping upwards, an insulating cover (28) is fitted.

The mold stands on a support (29) which, through the choice of its constituent material and its thickness, determines the conduction of heat downwards to a cooled metal plate (30). The support (29) may consist of ceramic materials such as, for example, aluminium oxide, mullite or silicon nitride, or even graphite in fibrous or compact form. The thickness and constituent material of the support must be adapted to the geometry of the heating element, i.e. the respective heat outputs of the individual conductor bands.

To melt a charge of coarse-grained silicon, the switch (31) in FIG. 1 is moved to position (2). In this way, a higher temperature is reached in the lowermost part than in the two upper bands. In this phase of the process, the cooling of the metal plate (30) is reduced or switched off to save energy. The greater heat output of the lower part of the sheet-form heating element compensates the residual dissipation of heat. In this state, a homogeneous temperature field is obtained in the mold, causing the charge to melt after reaching its melting point. With minimal heat loss, a homogeneous temperature field may be directly produced by switching to position (3).

To initiate the directional solidification process, a temperature gradient has to be imposed on the walls of the mold. To achieve this, the base plate (30) is cooled and the switch (31) in FIG. 1 moved into position (4). In this way, the lower two conductor bands of the heating element are connected in parallel so that the upper heating band becomes hotter and the two lower bands cooler. By virtue of the electrically symmetrical design of the heating element, the overall output remains constant, apart from a transitional phase during switching.

The temperature of the mold wall can be measured at various points by means of thermocouples (32) which are best pushed through the retaining tubes (20).

The solidification rate may be determined from the change in temperature accompanying the passage of the solid-liquid interface.

After solidification of the charge, the cooling of the base plate is further reduced and the switch (31) is moved into position (2) so that a homogeneous temperature field is re-established. The heat output is then reduced and the entire block cooled.

This procedure gives columnarly solidified ingots having very well-directed crystal grains several centimeters in length for a width of about 1 cm, such as are obtained where a flat solid-liquid phase interface is developed. By suitably selecting the cooling rate, the formation of internal stresses is avoided. By monitoring the solidification rate, it is possible to influence it by varying the heat output so that it may be optimized to avoid the back-diffusion of impurities transported ahead of the phase interface.

The process explained with reference to the relatively simple version of the sheet-form heating element shown in FIG. 1 may be improved by using optimized heater geometries.

Thus, in one possible sheet-form heating element, the substantially meander-form resistance band is subdivided by further comb-like slots so that various possibilities are available for establishing suitable temperature gradients. The temperature gradient may be intensified by an additional resistance meander in the uppermost heating band which may be folded over the mold opening. This embodiment is particularly appropriate for large molds to compensate heat loss through the upper mold insulation.

By time-coordinated parallel connection of the individual heating bands, the temperature gradient may be varied as a function of time so that the solidification rate may be adapted to different mold cross-sections.

Thus far, the structure and operation of the apparatus according to the invention has been explained with reference to a sheet-form heating element made of a metal resistance sheet.

Graphite foils may also be used, although in their case the greater sensitivity to bending must be taken into account in the geometry of the mold.

According to the invention, graphite plates may also be used as the constituent material of the heating element. In this case, however, the individual heating bands have to be connected to one another. It has been found that commercial graphite adhesives may be used for this purpose, although in this case the cross-sectional area has to be increased at the bond in order to compensate the greater surface resistance of the connection. So far as the expert is concerned, this problem may readily be solved by a suitable increase in thickness.

The following Examples are intended to illustrate the process and apparatus according to the invention without limiting either in any way.

EXAMPLE 1

A heating element of the type shown in FIG. 1 was prepared from a 0.2 mm thick rolled Mo-sheet, the upper and lower heating bands each being 74 mm wide and the middle heating band 22 mm wide. The slot width between the bands was 5 mm.

With this arrangement, a heat output ratio of $96/74 = 1.30$ may be adjusted by connecting a outer heating band in parallel with the middle heating band. This heating element may be bent into a hollow form and held in a supporting structure of the type shown in FIG. 2. In this way, the apparatus as a whole is made into a self-supporting unit having an inside width of 150 mm square. A mold having a base area of ca. $120 \times 120$ mm filled with silicon granulate is introduced into the cavity. The arrangement as a whole was placed on a water-cooled metal plate with a 5 mm graphite felt met in between. From above, the apparatus was insulated against heat loss by a 30 mm thick hard felt board on a 5 mm graphite plate held by a metal jacket. The same type of insulation was used for the side walls of the supporting structure. The heating element was secured by correspondingly long ceramic pins so that there was no electrical contact with the insulation.

The arrangement as a whole was heated in an argon atmosphere by passing current through the sheet-form heating element with the switch in position (2) (in FIG. 1). The temperatures were measured by EL 18 thermocouples introduced into the hollow ceramic pins. When the melting point of silicon (1420° C.) was reached, the difference in temperature over the height of the mold was ca. 10° C.

After melting of the charge, the switch was moved into position (4), reducing the heat output in the lower part of the mold. Through the dissipation of heat via the cooled metal plate, the melt solidified in the upward direction. The passage of the solidification front could be followed from the change in temperature of the thermocouples. The entire charge had solidified completely after ca. 1.5 h so that the overall heat output could be reduced. Cooling to room temperature took place at an average of 200° C./h.

A silicon block in which the crystal grains were vertically oriented was then removed from the mold. The grains were on average 50 mm long for a diameter of 6–10 mm. The flat interface between the high-impurity and low-impurity zones in the uppermost part of the block attributable to the segregation effect is indicative of a flat phase interface during solidification.

EXAMPLE 2

In accordance with FIG. 1, four-part heating bands 74 mm and 22 mm wide were prepared from 5 mm thick graphite plates. The lengths were so determined that, when assembled, the heating element formed a square hollow body having an inside width of ca. 150 mm. Those heating bands to which the current leads were fastened were made 70 mm longer. The individual heating bands of the element, which form a resistance path, were joined by bonding aided by a graphite section which doubled the cross-section over a length of 15 mm. The three resistance bands with the comb-like connector were spaced from one another by ceramic pins, as shown in FIG. 2. To establish an overall resistance of ca. 120 m Ω, additional slots had to be cut into the individual heating bands perpendicular to the flow of current.

With this arrangement, silicon was melted and then directionally solidified in an argon atmosphere as in Example 1. A coarsely crystalline columnar Si-block with well-developed crystal grains, even at its edges, was obtained.

What is claimed is:

1. A process for the production of unidirectionally; and columnarly solidified silicon bodies by completely melting silicon and then solidifying said silicon in a crucible having substantially vertical sides, wherein the dissipation of heat is greater at the upper or lower end of the crucible than at the vertical sides, which comprises substantially avoiding dissipation of heat through the vertical sides of the crucible by continuously supplying heat to the vertical sides of the crucible during solidification of the silicon through a single heating element having heating sections in such a quantity that a melt of the silicon is formed, and establishing a directional solidification by establishing a temperature gradient by varying the heat output among the heating sections of the heating element.

2. A process as claimed in claim 1 wherein the single heating element is comb-shaped, and the slots of the comb-shaped element are connected to form a plurality of parallel electric current paths forming the plurality of heating sections.

* * * * *